United States Patent [19]

Umeda et al.

[11] Patent Number: 4,509,173
[45] Date of Patent: Apr. 2, 1985

[54] PHASE-LOCKED SEMICONDUCTOR LASER DEVICE

[75] Inventors: Jun-ichi Umeda, Hachioji; Hisao Nakashima, Tokorozawa; Takashi Kajimura, Hachioji; Takao Kuroda, Kokubunji, all of Japan

[73] Assignee: Hitachi, Ltd., Tokyo, Japan

[21] Appl. No.: 366,324

[22] Filed: Apr. 7, 1982

[30] Foreign Application Priority Data

Apr. 15, 1981 [JP] Japan ............................... 56-55547

[51] Int. Cl.³ .............................................. H01S 3/19
[52] U.S. Cl. ...................................... 372/50; 357/17; 372/45
[58] Field of Search ................. 372/50, 45, 46; 357/17

[56] References Cited

U.S. PATENT DOCUMENTS 4,185,256  1/1980  Scifres et al. ......................... 372/46
4,255,717  3/1981  Scifres et al. ......................... 372/50
4,369,513  1/1983  Umeda et al. ......................... 372/46

FOREIGN PATENT DOCUMENTS 0010949  5/1980  European Pat. Off. ............. 372/50

*Primary Examiner*—James W. Davie
*Attorney, Agent, or Firm*—Antonelli, Terry & Wands

[57] ABSTRACT

A semiconductor laser device is provided with a semiconductor substrate and at least a semiconductor assembly for optical confinement formed on the substrate which includes an active layer and cladding layers. A first electrode is disposed on the semiconductor assembly and a second electrode is disposed on the semiconductor substrate. To provide a phase-locked semiconductor laser device of high quality, a plurality of regions are provided in the semiconductor assembly which, in effect, cause a variation of a complex refractive index for a laser beam in a direction intersecting with a traveling direction of the laser beam. These regions can be discretely disposed over or under the active layer and give rise to a nonlinear interaction between adjacent laser emission regions formed by the plurality of regions.

12 Claims, 8 Drawing Figures

PHASE-LOCKED SEMICONDUCTOR LASER DEVICE

BACKGROUND OF THE INVENTION

1. Field of the Invention

The present invention relates to the structure of a phase-locked semiconductor laser of same phases and high optical output.

2. Description of the Prior Art

In case of rendering the optical output of a semiconductor laser high, it is indispensable from the standpoint of practical use that a laser beam has optical properties permitting condensing or collimation to the diffraction limitation.

In a semiconductor laser device having the ordinary double-heterostructure, it has been proposed to increase the optical output of the whole device by juxtaposing a plurality of emission portions of strips. The proposal is described in, for example, the literature of Appl. Phys. Lett. 34(2), Jan. 15, 1979, pp. 162-165. In actuality, however, the modes, wavelengths and phases of laser beams become different in the respective strips, and there has not been obtained a laser beam of high quality which is applicable to optical communication, an optical disk memory, a laser printer or the like.

SUMMARY OF THE INVENTION

The present invention provides a phase-locked semiconductor laser device furnished locally in the vicinity of an active layer with a parallel or meshed structure in the traveling direction of the laser beam, which produces a variation of a complex refractive index for laser beams so that the emissions of various points are regulated into the fundamental transverse mode and that photo coupling is caused between the emissions of the adjacent points. The expression "phase-locked semiconductor laser" signifies a semiconductor laser in which, when the emission facet thereof is viewed in the direction of laser radiation, a plurality of principal emission regions are observed. Since the laser beams from the plurality of emission points are photo-coupled with each other as described above, the whole optical output has a coherency of same wavelengths and phases in this phase-locked semiconductor laser, and a laser beam of high output capable of the condensing and collimation is obtained.

The local variation of the complex refractive index for the laser beams is formed by establishing a spatially local variation of refractive index, optical absorption or gain (or any combination of them). By establishing such local changes of the complex refractive index, local laser emission regions are formed. In lasing, however, the radiation distributions of the laser beams oscillating in the active region spread more than the widths of the local emission regions. Accordingly, the intervals of the local emission regions are made small so that the radiation distributions of the laser beams may be connected with each other to cause the photo coupling. Thus, the laser oscillations of the respective local emissions are held at equal wavelengths and in phase.

The fundamental construction of the present invention is as follows:

In a semiconductor laser device having on a predetermined semiconductor body, at least a semiconductor assembly for optical confinement which includes an active layer and cladding layers, a first electrode which is disposed on said semiconductor assembly, a second electrode which is disposed on the semiconductor substrate side, and means to construct an optical resonator; a semiconductor laser device characterized in that a plurality of regions which, in effect, cause a variation of a complex refractive index for a laser beam in a direction intersecting with a traveling direction of the laser beam are discretely disposed over or under said active layer, and that local emissions of adjacent lasers give rise to a nonlinear optical interaction therebetween.

DETAILED DESCRIPTION OF THE PREFERRED EMBODIMENTS

As stated before, the subject matter of the present invention consists in that means to form the variation of a complex refractive index locally in the traveling direction of a laser beam is disposed in the vicinity of an active layer.

Various concrete aspects of this means are considered.

Figure 4:
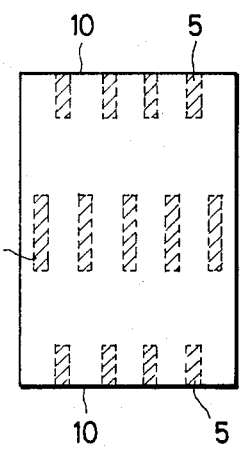
Figure 5:
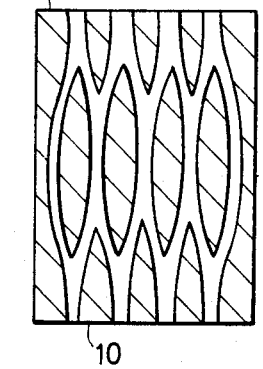
Figure 6:
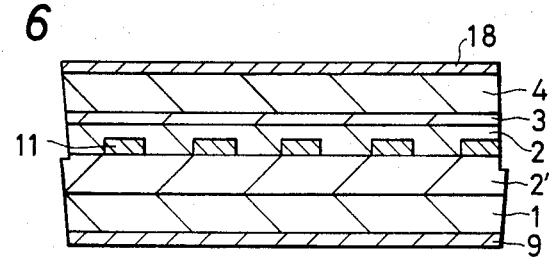
FIGS. 6 to 8 are sectional views showing different examples of the semiconductor laser device of the present invention.

First, an arrangement of a stripped or islanded optical absorption layer which is parallel to the traveling direction of the laser beam will be considered. Examples of this aspect are shown in a perspective view of FIG. 1 and plan views of FIGS. 2-5. The optical absorption layer may be disposed either over the active layer or under the same. FIGS. 1 through 5 show the optical absorption layer arranged over the active layer. A device whose sectional view is shown in FIG. 6 is an example in which the optical absorption layer is disposed under the active layer.

Figure 7:
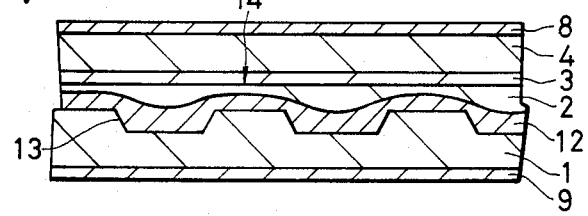
Figure 8:
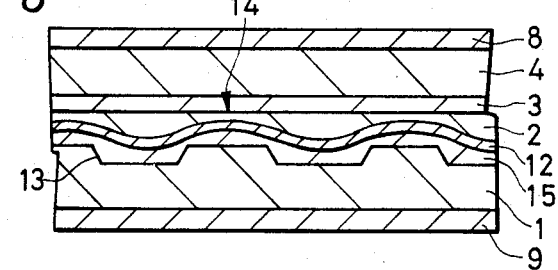

Secondly, the optical absorption layer may be formed with uneven parts and disposed over or under the active layer. The distance between the active layer and the optical absorption layer becomes unequal, and substantially no optical absorption takes place in the part of longer distance, whereas optical absorption occurs in the part of shorter distance. FIGS. 7 and 8 are sectional views of devices showing such examples.

Naturally, embodiments modified along the subject matter of the present invention are considered.

The phase-locked semiconductor laser device of the present invention is advantageous in fabrication because the active layer playing an important role for lasing is not processed. Furthermore, a phase-locked semiconductor laser device of low threshold current can be provided.

Hereunder, the present invention will be concretely described in detail in conjunction with embodiments.

Figure 1:
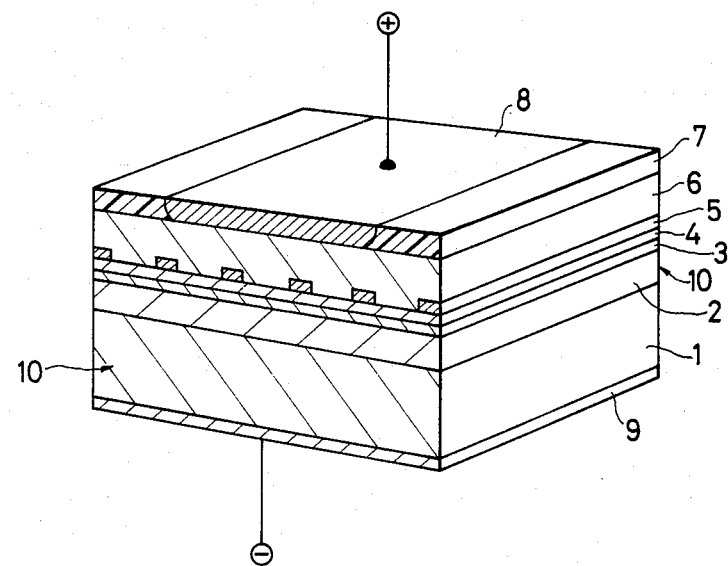
FIG. 1 is a perspective view showing an example of a semiconductor laser device according to the present invention.

Embodiment 1:

FIG. 1 is a perspective view of a typical semiconductor laser device according to the present invention.

On a predetermined n-type GaAs substrate 1, the following layers are stacked:

(1) n-type $Ga_{1-s}Al_sAs$ layer 2 ($s > x + 0.3$ where x denotes the mole fraction of AlAs of an active layer; doped with Sn, Te, Se or the like; impurity concentration $n = 3 \times 10^{17 \pm 1}$ cm$^{-3}$; thickness:

$1 \binom{+4}{-0.5}$ μm), (2) $Ga_{1-x}Al_xAs$ layer 3 ($x = 0.15 \pm 0.15$; thickness:

$0.1 \binom{+0.4}{-0.07}$ μm), and
(3) p-type $Ga_{1-y}Al_yAs$ layer 4 ($y = x + 0.4$; thickness:

$0.2 \binom{+0.3}{-0.1}$ μm;

doped with Zn, Ge, Mg or the like; impurity concentration $p = 3 \times 10^{17 \pm 1}$ cm$^{-3}$).

The $Ga_{1-s}Al_sAs$ layer 2 and the $Ga_{1-y}Al_yAs$ layer 4 are cladding layers, and the $Ga_{1-x}Al_xAs$ layer 3 is the active layer.

Figure 2:
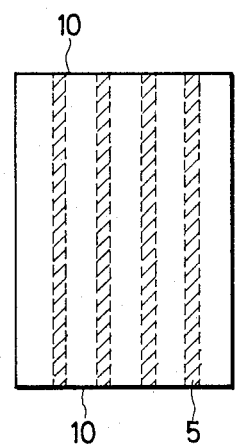
FIGS. 2 to 5 are views for explaining the plan arrangements of optical absorption layers.
Figure 3:
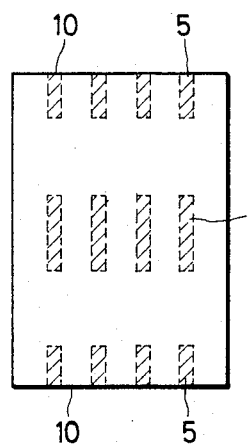

On the $Ga_{1-y}Al_yAs$ layer 4, there is disposed a striped or islanded optical absorption layer 5 which is parallel to the lasing direction. In an example, the optical absorption layer 5 was made of $Ga_{1-z}Al_zAs$ ($0 \leq z \leq x$) and was $0.3 \binom{+0.7}{-0.2}$ μm thick. (The dopant of the optical absorption layer does not especially come into question.) The plan configuration of the striped optical absorption layer is shown in FIG. 2, while the plan configurations of the islanded optical absorption layers are shown in FIGS. 3 and 4. In case of disposing the optical absorption layer in the shape of islands, as shown in FIG. 3, the respective islands of the optical absorption layer 5 may be arrayed in the form of a matrix in such a manner that the lengthwise direction of each island is parallel to the lasing direction. Alternatively, as shown in FIG. 4, the islands of the optical absorption layer 5 may be arrayed in such a manner that the groups of islands arranged in the widthwise direction thereof are alternatively staggered a half pitch in the direction orthogonal to the lasing direction. As shown in FIG. 5, the optical absorption layer may well be constructed in the shape of meshes in such a manner that laser beams substantially intersect to form a simply connected net. Further, it is allowed to provide narrow parts and wide parts in the respective islands of the optical absorption layer and to cause photo coupling between laser emission parts proximate to each other.

The width of each constituent of the optical absorption layer is $3 \pm 2$ μm. The pitch of the strips of the striped optical absorption layer is $10 \binom{+2}{-9}$ μm, and the pitch-to-width ratio is preferably selected within the range of 3–10. In case of the islanded optical absorption layer, a similar pitch may be selected. As the total length of the optical absorption layer in the lasing direction, approximately ½ of the length of an optical resonator (in general, the resonator length is 300 μm ± 200 μm) is suitable.

On the optical absorption layer 5, a $Ga_{1 \pm u}Al_uAs$ layer 6 is disposed to a thickness of $1 \binom{+4}{-0.5}$ μm.

This layer 6 may be fundamentally the same as the foregoing layer 4, but the mole fraction of AlAs, the carrier concentration etc. of the former may well be somewhat lower than those of the latter.

The various semiconductor layers mentioned above are formed by the well-known liquid phase epitaxial method. The processing, such as etching, of the semiconductor layers is satisfactorily carried out with any hitherto known method.

It is a matter of course that the well-known vapor phase epitaxial method, molecular beam epitaxial method etc. may well be used in forming the semiconductor layers.

On the layer 6, a metal layer 8 made of Cr - Au is formed as a region for injecting current, while on the rear surface of the GaAs substrate 1, a metal layer made of an Au - Ge alloy is formed as an electrode 9. Lastly, the crystal is cleaved along planes 10 perpendicular to the traveling direction of the laser beam so as to construct the optical resonator. Numeral 7 in FIG. 1 indicates an insulator layer.

A GaAs layer (for example, made of p-type GaAs, doped with Zn and having an impurity concentration of $1 \times 10^{18}$ cm$^{-3}$) is often formed as a cap layer on the semiconductor layer 4. A thickness of approximately 0.5 μm is sufficient therefor. Although there can be modifications in which further semiconductor layers are disposed, such measures are not pertinent to the essentials of the present invention.

In an example, the oscillation characteristics of a semiconductor laser device in which the optical absorption layer 5 was formed as shown in FIG. 2 were as stated below. The resonator had a length of 300 μm and a width of 300 μm, and the number of emission strips was 30. The oscillation wavelength was 760 nm, the threshold current value was 2.7 A, and the maximum optical output was 1.5 W at a voltage of 3 V and a current 4.2 A. The spread angle of an emergent beam was about 1° within both the surfaces of the active layer, and the perpendicular direction was about 30°. Using two cylindrical lenses, the emergent beam could be collimated and condensed to the diffraction limitation.

Embodiment 2:

This embodiment is an example in which an optical absorption layer is disposed on the substrate side. FIG. 6 is a sectional view of the semiconductor laser device seen from the facet of the optical resonator.

On a predetermined n-type GaAl substrate 1, an n-type $Ga_{1-s}Al_sAs$ layer 2' is formed to a thickness of about 1 μm. On the layer 2', a $Ga_{1-z}Al_zAs$ ($0 \leq z \leq x$) layer to become the optical absorption layer is formed to a thickness of 0.3 μm. Using the well-known etching, the $Ga_{1-z}Al_zAs$ layer is processed into the construction of the optical absorption layer shown in FIG. 2. The width of each strip of the optical absorption layer 11 is 3 μm, and the pitch of the strips is 10 μm. On the optical absorption layer, an n-type $Ga_{1-s}Al_sAs$ layer 2 is formed again, and it is overlaid with a non-doped $Ga_{1-x}Al_xAs$ layer 3 and a p-type $Ga_{1-y}Al_yAs$ layer 4. Excepting the thicknesses, the compositions etc. of the respective GaAlAs layers are the same as in the case of Embodiment 1. The $Ga_{1-s}Al_sAs$ layer 2 is made $$0.2 \begin{pmatrix} +0.3 \\ -0.1 \end{pmatrix} \mu m$$

thick between the $Ga_{1-x}Al_xAs$ layer 3 being the active layer and the optical absorption layer 11. The $Ga_{1-x}Al_xAs$ layer 3 is $$0.1 \begin{pmatrix} +0.4 \\ -0.07 \end{pmatrix} \mu m$$

thick, and the $Ga_{1-y}Al_yAs$ layer 4 is 1 μm thick. As in Embodiment 1, a cap layer is appropriately disposed on the layer 4.

Numerals 8 and 9 in FIG. 6 designate electrodes on the =side and −side, respectively, and these electrodes are similar to those of Embodiment 1. The construction of the optical resonator is also similar.

With the present structure, oscillation characteristics similar to those of Embodiment 1 were obtained.

Embodiment 3:

This embodiment illustrates another example in which an optical absorption layer is disposed on the substrate side. FIG. 7 is a sectional view of the semiconductor laser device seen from the facet of the optical resonator.

In the surface of an n-type GaAs substrate 1, a plurality of grooves 13 are provided in parallel with the direction of lasing. The width of each groove is 4 μm, the pitch of the grooves is $$7 \begin{pmatrix} +3 \\ -6 \end{pmatrix} \mu m,$$

and the depth of the groove is $$1 \begin{pmatrix} +1 \\ -0.5 \end{pmatrix} \mu m.$$

On the grooved n-type GaAs substrate 1, an n-type $Ga_{1-z}Al_zAs$ layer 12 ($0 \leq z \leq x$; $n=3\times 10^{17\pm 1}$ cm$^{-3}$; its dopant being Sn, Te, Se or the like) to serve as the optical absorption layer is corrugatedly provided along the shape of the grooves. Further, an n-type $Ga_{1-s}Al_sAs$ layer 2 ($s \geq x = 0.3$; $n+3\times 10^{17\pm 1}$ cm$^{-3}$; its dopant being Se, Te or Se) is formed. The thickness of the thinnest part 14 (over a part corresponding to the crest of the corrugated layer 12) of the n-type $Ga_{1-s}Al_sAs$ layer 2 to serve as the cladding layer is made approximately $$0.2 \begin{pmatrix} +0.3 \\ -0.1 \end{pmatrix} \mu m.$$

The corrugated semiconductor layer can be readily obtained by selecting the growth conditions of the crystal. The remaining construction is the same as in Embodiment 2.

Optical absorption occurs selectively in the thin parts 14 of the cladding layer 2, and substantially the same effect as in the striped optical absorption layer is achieved. As in Embodment 1, accordingly, a plurality of emission points and modes can be selected, and the photo coupling between laser beams from the adjacent emission points can be realized.

A further example in which the optical absorption layer is disposed on the substrate side is shown in FIG. 8. This figure is a sectional view of the semiconductor laser of the example. The optical absorption layer 12 is a wavy thin layer unlike that in the example of FIG. 7. The thickness of the optical absorption layer 12 in this example is $$0.2 \begin{pmatrix} +0.5 \\ -0.1 \end{pmatrix} \mu m.$$

A semiconductor layer 15 may be made of a material of the same system as the material of the semiconductor layer 2 or the semiconductor layer 12. The function of optical absorption is performed by the semiconductor layer 15. The remaining construction is the same as in the example of FIG. 7.

Embodiment 4:

While, in the foregoing embodiments, only the examples constructed of the n-type GaAs substrates have been described, a p-type GaAs substrate may well be use naturally. In this case, the conductivity types of the respective layers may be made the opposite conductivity types to those in the foregoing embodiments.

Needless to say, as regards the semiconductor materials, the present invention is not restricted to the semiconductor lasers of the GaAlAs - GaAs system, but it is similarly applicable to semiconductor lasers employing a compound semiconductor of a ternary system such as GaAlP, InGaP, GaAsP or GaAsSb system; a compound semiconductor of a quaternary system such as InGaAsP, GaAlAsSb or GaAlAsP system; etc. Naturally, these semiconductor lasers fall within the scope of the present invention.

Examples employing the InP - InGaAsP system materials will be described. The basic structure is the same as in FIG. 1.

On an n-type InP substrate 1, the following layers are stacked:

(1) n-type InP layer 2 (doped with Te; impurity concentration: $3.1\times 10^{17}$ cm$^{-3}$; thickness: 1 μm), (2) $In_{0.88}Ga_{0.12}As_{0.23}P_{0.77}$ layer 3 (thickness: 0.15 μm), and (3) p-type InP layer 4 (doped with Zn; impurity concentration: $3\times 10^{17}$ cm$^{-3}$).

The InGaAsP layer 3 is an active layer.

On the p-type InP layer 4, a striped or islanded optical absorption layer 5 parallel to the traveling direction of a laser beam is disposed. The optical absorption layer 5 is made of $In_{0.2}Ga_{0.8}As_{0.5}P_{0.5}$, and is 0.3 μm thick. The plan configurations of the striped and islanded optical absorption layers are the same as in FIGS. 2–4.

The width of each constituent of the optical absorption layer is $3\pm 2$ μm, and the pitch of the strips or islands of the optical absorption layer is $$10 \begin{pmatrix} +2 \\ -9 \end{pmatrix} \mu m.$$

The ratio between the pitch and the width is selected within a range of 3-10.

On the optical absorption layer 5, a p-type InP layer 6 is disposed to a thickness of 1 μm. This layer 6 may be fundamentally the same as the above layer 4.

Usually, a cap layer is disposed on the layer 6. The cap layer is made of $In_{0.73}Ga_{0.17}As_{0.38}P_{0.62}$. A Cr - Au electrode is used as a plus side electrode 8, while an Au - Sn electrode is used as a minus side electrode 9. Shown at numeral 7 is an insulating layer.

The number of strips is 15, the length of a resonator is 300 μm, and the width of the resonator is 400 μm.

Each semiconductor laser thus prepared exhibited an emission wavelength of 1.3 μm and a threshold current of 2.8 A, and produced a laser beam whose spread angle was about 2°-3° within both the surfaces of the active layer and whose perpendicular direction was about 30°.

What is claimed is:

1. A semiconductor laser device comprising:
    a semiconductor substrate having first and second major surfaces;
    a semiconductor assembly for optical confinement having a first major surface formed on said first major surface of said semiconductor substrate, said semiconductor assembly including an active layer, a first cladding layer formed on a side of said active layer which faces toward said semiconductor substrate and a second cladding layer formed on a side of said active layer which faces away from said semiconductor substrate;
    a first electrode formed on a second major surface of said semiconductor assembly; and
    a second electrode formed on said second major surface of said semiconductor substrate,
    wherein said semiconductor assembly further includes a plurality of regions which are optical absorption regions of an optical absorption layer formed in said semiconductor assembly between said second cladding layer and said first electrode which optical absorption regions cause a variation of a complex refractive index for a laser beam in a direction intersecting with a traveling direction of the laser beam such that local emissions of adjacent laser regions formed by said plurality of optical absorption regions give rise to a non-linear interaction therebetween.

2. A semiconductor laser device comprising:
    a semiconductor substrate having first and second major surfaces;
    a semiconductor assembly for optical confinement having a first major surface formed on said first major surface of said semi-conductor substrate, said semiconductor assembly including an active layer, a first cladding layer formed on a side of said active layer which faces toward said semiconductor substrate and a second cladding layer formed on a side of said active layer which faces away from said semiconductor substrate;
    a first electrode formed on a second major surface of said semiconductor assembly; and
    a second electrode formed on said second major surface of said semiconductor substrate,
    wherein said semiconductor assembly further includes a plurality of regions which are optical absorption regions of an optical absorption layer formed in said semiconductor assembly between said first cladding layer and said second electrode which optical absorption regions cause a variation of a complex refractive index for a laser beam in a direction intersecting with a traveling direction of the laser beam such that local emissions of adjacent laser regions formed by said plurality of optical absorption regions give rise to a non-linear interaction therebetween.

3. A semiconductor laser device according to claim 1, wherein said plurality of regions are constructed of a plurality of strip-like semiconductor layers which are parallel to the traveling direction of said laser beam and which are cyclically arrayed.

4. A semiconductor laser device according to claim 2, wherein said plurality of regions are constructed of a plurality of strip-like semiconductor layers which are parallel to the traveling direction of said laser beam and which are cyclically arrayed.

5. A semiconductor laser device according to claim 1, wherein said plurality of regions are constructed of strip-like islanded semiconductor layers which are parallel to the traveling direction of said laser beam and which are cyclically arrayed.

6. A semiconductor laser device according to claim 2, wherein said plurality of regions are constructed of strip-like islanded semiconductor layers which are parallel to the traveling direction of said laser beam and which are cyclically arrayed.

7. A semiconductor laser device according to claim 1, wherein said optical absorption layer comprises a variable thickness semiconductor material layer having a plurality of first thickness portions and a plurality of second thickness portions greater in thickness than said first thickness portions, wherein said first thickness portions and said second thickness portions are arranged alternately in a sectional structure in a plane perpendicular to the traveling direction of said laser beam.

8. A semiconductor laser device according to claim 2, wherein said optical absorption layer comprises a variable thickness semiconductor material layer having a plurality of first thickness portions and a plurality of second thickness portions greater in thickness than said first thickness portions, wherein said first thickness portions and said second thickness portions are arranged alternately in a sectional structure in a plane perpendicular to the traveling direction of said laser beam.

9. A semiconductor laser device according to claim 1, wherein intervals between said plurality of regions are set to cause photo-coupling between adjacent regions such that said local emissions are held at equal wavelengths and are in phase.

10. A semiconductor laser device according to claim 2, wherein intervals between said plurality of regions are set to cause photo-coupling between adjacent regions such that said local emissions are held at equal wavelengths and are in phase.

11. A semiconductor laser device according to claim 1, wherein a resonant laser beam oscillating in each laser region appears on each laser region in said active layer at a location where there is no optical absorption by said optical absorption regions.

12. A semiconductor laser device according to claim 2, wherein a resonant laser beam oscillating in each laser region appears on each laser region in said active layer at a location where there is no optical absorption by said optical absorption regions.

* * * * *